United States Patent
Negishi

(12) 
(10) Patent No.: US 6,456,545 B1
(45) Date of Patent: Sep. 24, 2002

(54) METHOD AND APPARATUS FOR DATA TRANSMISSION AND RECEPTION

(75) Inventor: Tatsuya Negishi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/010,230

(22) Filed: Dec. 7, 2001

(30) Foreign Application Priority Data

Dec. 11, 2000 (JP) ........................................ 2000-376705

(51) Int. Cl.[7] .................................................. G11C 7/00
(52) U.S. Cl. ......................................... 365/198; 365/203
(58) Field of Search ................................. 365/198, 203, 365/230.06, 189.01, 149, 189.11; 326/86

(56) References Cited

U.S. PATENT DOCUMENTS 6,154,397 A * 11/2000 Chu et al. .................... 365/198

FOREIGN PATENT DOCUMENTS

| JP | 07-302497 | 11/1995 |
| JP | 09-293841 | 11/1997 |
| JP | 11-016358 | 1/1999 |
| JP | 2000-048576 | 2/2000 |
| JP | 2000-149571 | 5/2000 |

OTHER PUBLICATIONS

English Bibliographies and Abstracts of JP 2000–149571, JP 07–302497, JP 11–016358, JP 09–293841, and JP 2000–048576 (noted above).

* cited by examiner

Primary Examiner—David Lam
(74) Attorney, Agent, or Firm—Darryl G. Walker

(57) ABSTRACT

A method and apparatus for data transmission and reception is disclosed. A data transmission/reception apparatus (300) may allow data to be transferred between a data bus (IOT and ION) and a bit line pair (Di and DBi). The data transmission/reception apparatus (300) may include a column select transfer gate circuit (12) that may receive column select signals (YU and YLi) from a column address decode circuit (14). Column select transfer circuit (12) may include a transfer gate circuit (12i) that may provide a data transmission/reception path between a data bus (IOT and ION) and a bit line pair (Di and DBi). Transfer gate circuit (12i) may include connection nodes that may have parasitic capacitors (Ci and CBi). A precharge circuit (16) may allow previous data signals stored on parasitic capacitors (Ci and CBi) to be removed during a precharge operation before a subsequent data transfer operation is executed.

20 Claims, 6 Drawing Sheets

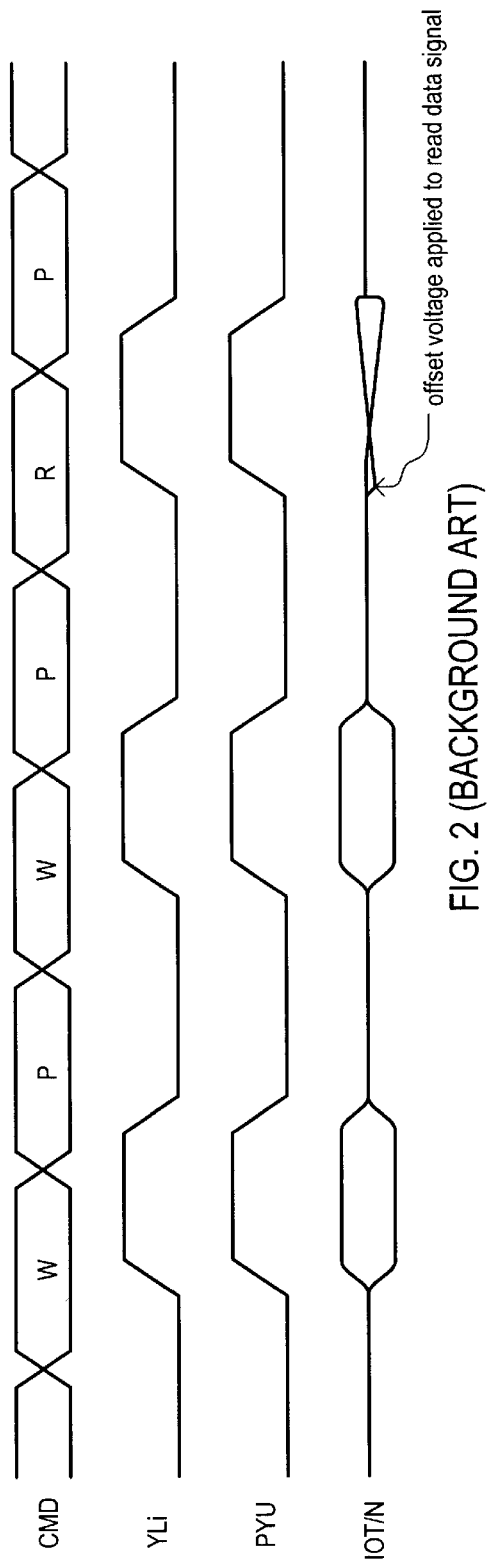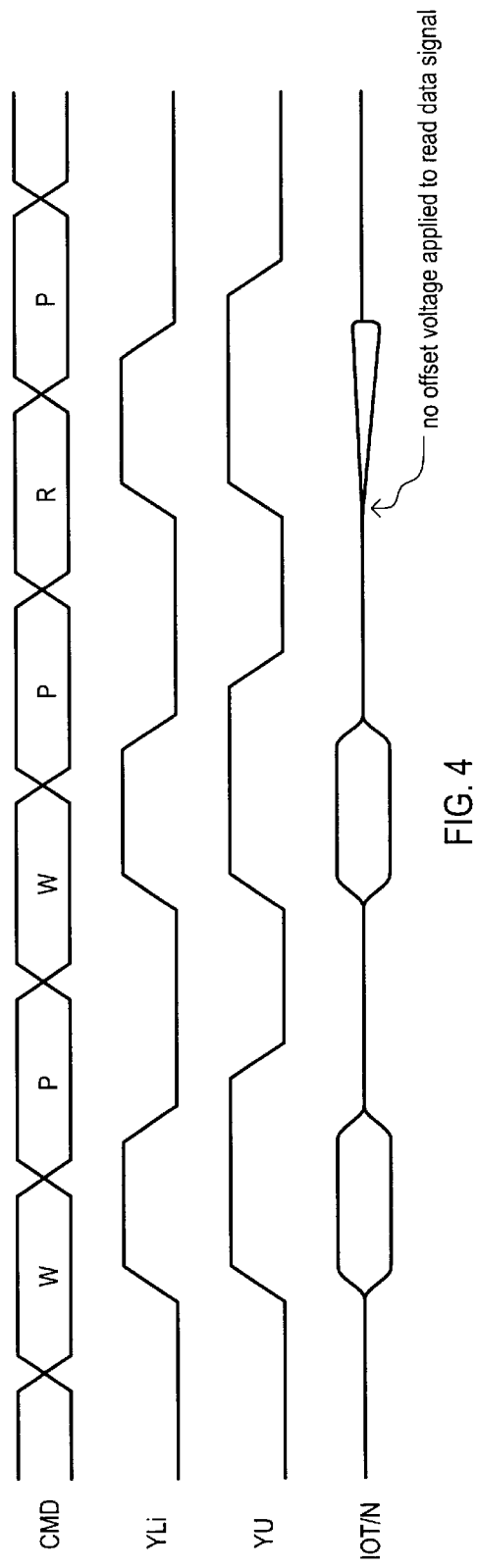

METHOD AND APPARATUS FOR DATA TRANSMISSION AND RECEPTION

TECHNICAL FIELD

The present invention relates generally to a method and an apparatus for data transmission and reception and more specifically to a method and an apparatus in which an offset voltage may be prevented on a floating capacitance in a connection node between a first transfer device and a second transfer device.

BACKGROUND OF THE INVENTION

A conventional semiconductor memory device may have a column select transfer gate for transferring a data bit signal amplified in a sense amplifier to a data bus.

Referring now to FIG. 1, a portion of conventional semiconductor memory device is set forth in a schematic diagram and given the general reference character 100.

Conventional semiconductor memory device 100 is formed on a semiconductor substrate 10S. Conventional semiconductor memory device 100 includes a column select transfer gate circuit 11 connected to data buses (IOT and ION) and bit line pairs (D1 and DB1 to Dn AND DBn). Transfer gate circuit 11 also is connected to receive column select signal PYU and column select signals (YL1 to YLn). Column select transfer gate circuit 11 is arranged such that column select transfer gates (M1$i$ and M2$i$) are connected in series between bit line Di and column select transfer gates (M1Bi and M2Bi) are connected in series between bit line DBi (i can be a number between 1 and n, where n is the number of columns of memory cells illustrated). N-type MOSFETs (metal oxide semiconductor field effect transistors) are used for column transfer gates (M1$i$, M2$i$, M1Bi, and M2Bi). A bit line pair (Di and DBi) transmits complementary binary data signals indicating the logic value of one data bit.

A parasitic capacitor (Ci and CBi) is formed at the connection point of series connected column select transfer gates (M1$i$-M2$i$ and M1Bi-M2Bi) and is illustrated having one node connected to the connection point and another node connected to ground.

A column address decode circuit 13 receives and address signal from a command bus pad 10CMD and generates column select signal PYU and column select signals (YL1 to YLn). Column select signal PYU is received at a gate of each column select transfer gate (M11 to M1$n$ and M1B1 to M1Bn). Column select signal YLi is received at a gate of each column select transfer gate (M2$i$ and M2Bi). Column select signal PYU and column select signal YLi are supplied simultaneously from address decode circuit 13. Address decode circuit 13 decodes a column address received with an access command when accessing conventional semiconductor memory device 100.

A sense amplifier Si is connected between bit line pair (Di and DBi). Bit line Di is electrically connected to data bus IOT when column select transfer gates (M2$i$ and M1$i$) are turned on. Bit line DBi is electrically connected to data bus ION when column select transfer gates (M2Bi and M1Bi) are turned on.

Data buses (IOT and ION) are connected to a precharge circuit 15 and data bus pad 10DB on semiconductor substrate 10S.

A description of the operation of conventional semiconductor memory device 100 will now be described with reference to FIGS. 1 and 2. FIG. 2 is a timing diagram illustrating the operation of conventional semiconductor memory device 100 for various cycles. Column select transfer gates (M1$i$, M2$i$, M1Bi, and M2Bi) of conventional semiconductor memory device 100 operate as follows.

When no access to the conventional semiconductor memory device 100 is taking place, column address decode circuit 13 outputs column select signal PYU and column select signal YLi having a low level.

With column select signal PYU and column select signal YLi at a low level, column select transfer gates (M1$i$, M2$i$, M1Bi, and M2Bi) are all turned off and bit line pair (Di and DBi) are not electrically connected to data buses (IOT and ION), respectively.

When a write command W is received by conventional semiconductor memory device 100 as an external input command, a column address in the write command (W in FIG. 2) is supplied to column address decode circuit 13 through command bus pad 10CMD. Column address decode circuit 13 generates a column select signal PYU and column select signal YLi having a high level accordingly.

With column select signal PYU and column select signal YLi at a high level, column select transfer gates (M1$i$, M2$i$, M1Bi, and M2Bi) are all turned on and bit line pair (Di and DBi) are electrically connected to data buses (IOT and ION), respectively. In this way, data may be transferred from data buses (IOT and ION) to bit line pair (Di and DBi) and written into a memory cell (not shown) that is connected to bit line pair (Di and DBi) and that has already been turned on in response to a row address.

Subsequently, at the end of the write operation, column select signal PYU and column select signal YLi are simultaneously switched from the high level to the low level. With column select signal PYU and column select signal YLi at a low level, column select transfer gates (M1$i$, M2$i$, M1Bi, and M2Bi) are all turned off and bit line pair (Di and DBi) are not electrically connected to data buses (IOT and ION), respectively. In this way, connection nodes having parasitic capacitors (Ci and CBi) become floating and charge stored on parasitic capacitors (Ci and CBi) becomes trapped or stored.

Subsequently, the data buses (IOT and ION) are precharged with precharge circuit 15 in response to a precharge command (P in FIG. 2) supplied through command bus pad 10CMD. Data busses (IOT and ION) are precharged to an intermediate level (precharge level). However, at this time, connection nodes having parasitic capacitors (Ci and CBi) remain floating and can have different voltages in accordance with the logic value of data previously written.

Subsequently, when a read command (R in FIG. 2) is received by conventional semiconductor memory device 100, address decode circuit 13 supplies a column select signal PYR and column select signal YLi having a high level in response to a column address.

In the read command, a row address is supplied to a row address decode circuit (not shown) and a row of memory cells (not shown) are selected. Sense amplifiers (S1 to Sn) amplify data received from the memory cells. Thus, a row of memory cells is simultaneously selected.

When column select signals (PYR and YLi) become high, the connection nodes having parasitic capacitors (Ci and CBi) become electrically connected to bit line pair (Di and DBi) and data buses (IOT and ION). Because parasitic capacitors (Ci and CBi) can have different voltage potentials as previously described, an offset voltage can be produced on the data buses (IOT and ION). This offset can affect the access speed and/or logic integrity of data supplied from sense amplifier Si and read out on data buses (IOT and ION).

Japanese Laid-Open Patent Publication No. 2000-149571 (JP 2000-149571) discloses a conventional semiconductor integrated circuit device.

JP 2000-149571 discloses a conventional semiconductor integrated circuit device including bit line pairs divided into groups having different capacitance values. A charge transfer device is included to separate bit line pairs. The charge transfer device is switched off before electric charge is provided to bit line pairs and a sense amplifier in a read operation.

A reference electric potential supply circuit is provided and a charge transfer device is switched on to provide charge to a connection point including a parasitic capacitor (for example, Ci and CBi). Then the other charge transfer device is turned on to supply electric charge to a detection/ amplification line.

However, similarly as discussed above, the conventional semiconductor integrated circuit device disclosed in JP 2000-149571 has a drawback in that after a write operation in which data is written, electric charge is stored or trapped on capacitors (Ci and CBi) which are floating. During a subsequent read cycle, the signal provided by the electric charge is stored or trapped on capacitors (Ci and CBi) can be superimposed on the read data. If the data signal during a subsequent read cycle is complementary to the trapped charge on capacitors (Ci and CBi), which can correspond to the logic levels of the previous write data, then the read data can have an offset. This problem is illustrated in FIG. 2 on data buses IOT and ION during the read cycle R.

As can be seen, the electric charge stored on capacitors (Ci and CBi) needs to be discharged before the read operation so that an offset does not occur.

JP 2000-149571 is adapted so that the transistor disposed between the detection/amplification line and electric charge transfer devices is turned off. Then electric charge indicating a logic value of information stored is supplied to the connection point between two electric charge transfer devices and the transistor on the side of the detection/ amplification line is switched on to supply the electric charge to the detection/amplification line.

The electric charge described above is used to detect and amplify the logic value of information stored in the memory cell and is not applied to discharge or precharge the electric charge stored on capacitors (Ci and CBi).

In light of the above discussion, it would be desirable to provide a method and an apparatus for data transmission and reception that may include signal transfer devices connected in series that may be activated to transfer data in a first data transfer direction. Thereafter, electric charge stored on parasitic capacitors at the connection point of the signal transfer devices may be precharged. In this way, a subsequent data transfer in the opposite direction may not be adversely affected.

SUMMARY OF THE INVENTION

A method and apparatus for data transmission and reception according to the present embodiments may include a data transmission and reception apparatus that may allow data to be transferred between a data bus and a bit line pair. The data transmission/reception apparatus may include a column select transfer gate circuit that may receive column select signals from a column address decode circuit. The column select transfer circuit may include a transfer gate circuit that may provide a data transmission/reception path between a data bus and a bit line pair. Transfer gate circuit may include connection nodes that may have parasitic capacitors. A precharge circuit may allow previous data signals to be removed during a precharge operation before a subsequent data transfer operation is executed. In this way, an offset voltage may be eliminated from the data signal and data integrity may be improved.

According to one aspect of the embodiments, a method for data transmission/reception may include activating essentially simultaneously a first signal transfer device and a second signal transfer device electrically connected in series to provide a data transfer path between a first data transmission/reception apparatus and a second data transmission/reception apparatus. After bringing the second signal transfer device into a second signal transfer device data transfer interrupt state, an electric potential may be set on a parasitic capacitor at a connection point between the first signal transfer device and the second signal transfer device. Upon completion of setting the electric potential, the first signal transfer device may be brought into a first signal transfer device data interrupt state.

According to another aspect of the embodiments, data being transmitted may have data values represented by first and second electric potential levels. Setting the electric potential may include precharging the electric potential at the connection point to a precharge level between the first and second electric potential levels after bringing the second signal transfer device into the second signal transfer device data interrupt state.

According to another aspect of the embodiments, precharging may include precharging a first data transmission/ reception data line to essentially the electric potential within a time period. The time period being after a second signal transfer device is in a second signal transfer device data transfer interrupt state, and before the first signal transfer device is in a first signal transfer device data transfer interrupt state.

According to another aspect of the embodiments, the transmission of data between the first data transmission/ reception apparatus and the second data transmission apparatus may be achieved by essentially simultaneously transmitting complementary data values.

According to another aspect of the embodiments, the second data transmission/reception apparatus may be a semiconductor memory having data transmitted on a bit line electrically connected to the second signal transfer device. The first data transmission/reception apparatus may include a first data transmission/reception data line electrically connected to the first signal transfer device. Precharging may include precharging a first data transmission/reception data line to essentially the electric potential during a time period from bringing the second signal transfer device into the second signal transfer device data transfer interrupt state to bringing the first signal transfer device into the first signal transfer device data transfer interrupt state.

According to another aspect of the embodiments, an apparatus for data transmission/reception in which data may be transferred between a second data transmission/reception apparatus and a first data transmission/reception apparatus through a first signal transfer device and a second signal transfer device electrically connected in series may include a first data transfer passage electrically connected to the first data transmission/reception apparatus and the first signal transfer device. The second signal transfer device may be electrically connected between the first signal transfer device and the second data transmission/reception apparatus. The first signal transfer device and the second signal transfer device may be activated essentially simultaneously to transfer data from the first data transmission/reception apparatus to the second data transmission/reception apparatus. Data being transferred may have data values represented by first and second electric potential levels. A transfer device control circuit may supply a second control signal coupled to a control terminal of the second signal transfer device and a first control signal coupled to a control terminal of the first signal transfer device. The second control signal may disable the second signal transfer device a predetermined time before the first control signal disables the first signal transfer device after the transfer of data. A precharge circuit may be coupled to supply a precharge level that may be between the first and second electric potential levels to the first data transfer passage during the predetermined time before the first control signal disables the first signal transfer device after the transfer of data.

According to another aspect of the embodiments, the precharge circuit may begin supplying the precharge level to the first data transmission passage after the second control signal disables the second signal transfer device.

According to another aspect of the embodiments, the precharge circuit may precharge the first data transmission passage to essentially the precharge level during the predetermined time before the first control signal disables the first signal transfer device.

According to another aspect of the embodiments, the transfer of data may include transferring complementary data signals.

According to another aspect of the embodiments, a third signal transfer device may be connected in parallel with the first signal transfer device and may have a control terminal coupled to receive the first control signal.

According to another aspect of the embodiments, the first signal transfer device and the second signal transfer device may be insulated gate field effect transistors (IGFETs).

According to another aspect of the embodiments, the first data transfer passage, the first signal transfer device, the second signal transfer device, the second data transmission/reception apparatus, and the transfer device control circuit may be formed on a semiconductor substrate and an output of the first data transmission/reception apparatus may be coupled to a pad formed on the semiconductor substrate. The pad may be further coupled to the first data transfer passage.

According to another aspect of the embodiments, the precharge circuit may be formed on the semiconductor substrate and may supply the precharge level to the first data transfer passage in response to a precharge command received by at least one command pad formed on the semiconductor substrate.

According to another aspect of the embodiments, the first data transmission/reception apparatus may be a data processing apparatus. The second data transmission/reception apparatus may be a semiconductor memory device including a bit line electrically connected to the second signal transfer device. The first data transfer passage may be a data bus for transferring data between the data processing apparatus and the semiconductor memory device. The first control signal may be a first column select signal generated on the basis of at least a first portion of a column address supplied form the data processing apparatus to the semiconductor memory device. The second control signal may be a second column select signal generated on the basis of at least a second portion of the column address.

According to another aspect of the embodiments, an apparatus for data transmission/reception may include a transfer circuit including a first signal transfer device and a second signal transfer device electrically connected in series to provide a first data transfer path between a first data transmission/reception apparatus and a second data transmission/reception apparatus. A transfer device control circuit may be coupled to the transfer circuit. The transfer device control circuit may activate the first and second signal transfer devices to transfer data from the first data transmission/reception apparatus to the second data transmission/reception apparatus and may disable the second signal transfer device a predetermined time before disabling the first signal transfer device after the data transfer. A precharge circuit may be coupled to supply a precharge level to a first connection node between the first signal transfer device and second signal transfer device during the predetermined time.

According to another aspect of the embodiments, the precharge level may be supplied through the first signal transfer device to the first connection node.

According to another aspect of the embodiments, the first signal transfer device may be electrically connected to a first data line of the first data transmission/reception apparatus and the second signal transfer device may be electrically connected to a second data line of the second data transmission/reception apparatus. The precharge circuit may supply the precharge level to the first data line.

According to another aspect of the embodiments, the transfer circuit may include a third signal transfer device and a fourth signal transfer device electrically connected in series to provide a complementary first data transfer path between the first data transmission/reception apparatus and the second data transmission/reception apparatus. The transfer device control circuit may be coupled to the transfer circuit. The transfer device control circuit may activate the third and fourth signal transfer devices to transfer data from the first data transmission/reception apparatus to the second data transmission/reception apparatus and may disable the fourth signal transfer device the predetermined time before disabling the third signal transfer device after the data transfer. The precharge circuit may be coupled to supply the precharge level to a second connection node between the third signal transfer device and the fourth signal transfer device during the predetermined time. The third signal transfer device may be electrically connected to a complementary first data line of the first data transmission/reception apparatus. The fourth signal transfer device may be electrically connected to the complementary second data line of the second data transmission/reception apparatus. The precharge circuit may supply the precharge level to the complementary first data line.

According to another aspect of the embodiments, the transfer device control circuit may be a column address decoder circuit.

According to another aspect of the embodiments, data may be transmitted in a complementary fashion having a first potential and a second potential and the precharge level may be between the first and second potentials.

BRIEF DESCRIPTION OF THE DRAWINGS

FIG. 2 is a timing diagram illustrating the operation of a conventional semiconductor memory device.

FIG. 4 is a timing diagram illustrating data transmission during a write operation and data reception during a read operation of a data transmission/reception apparatus according to one embodiment.

DETAILED DESCRIPTION OF THE EMBODIMENTS

Various embodiments of the present invention will now be described in detail with reference to a number of drawings.

Figure 1:
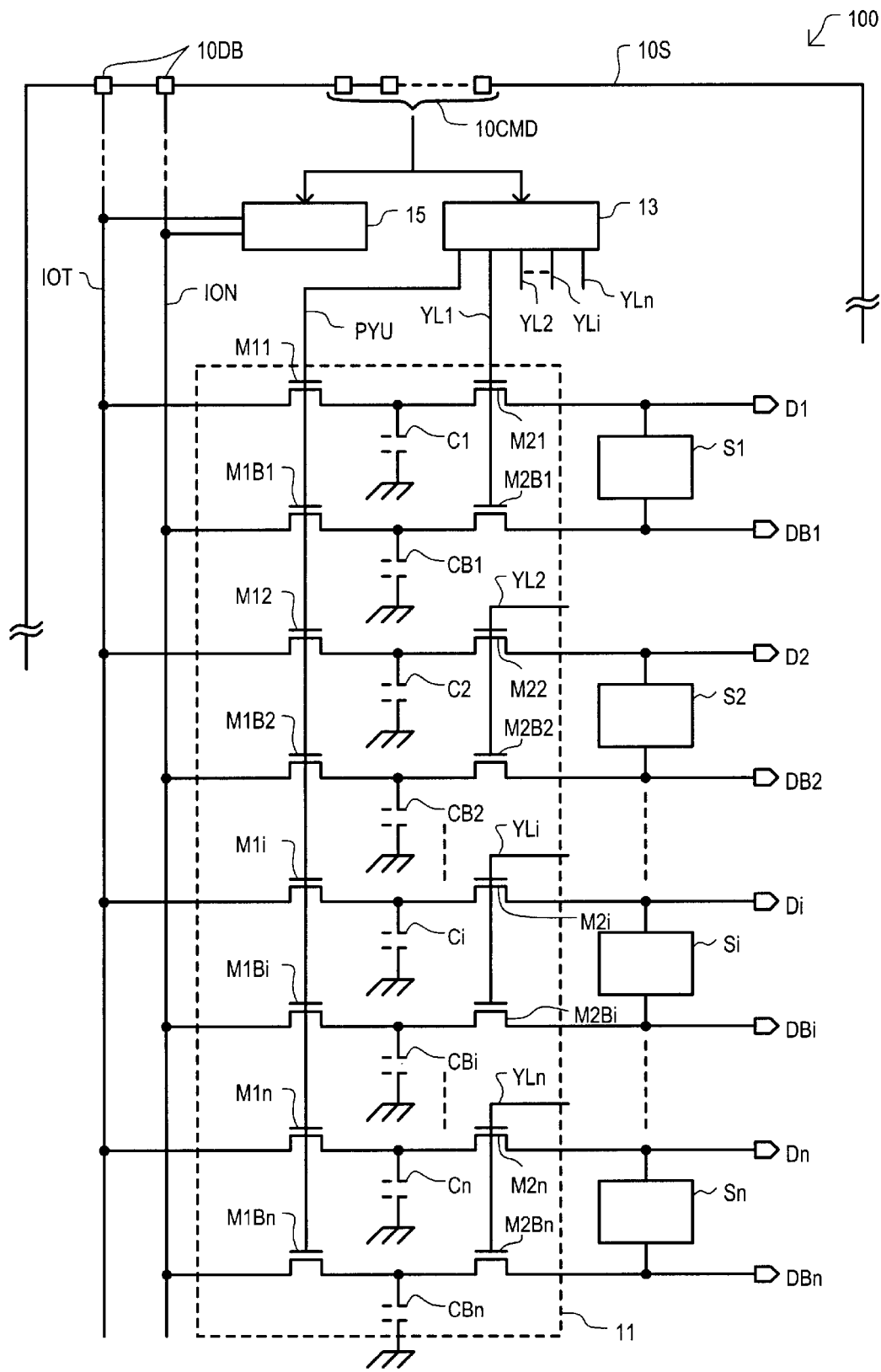
FIG. 1 is schematic diagram of a portion of conventional semiconductor memory device.
Figure 3:
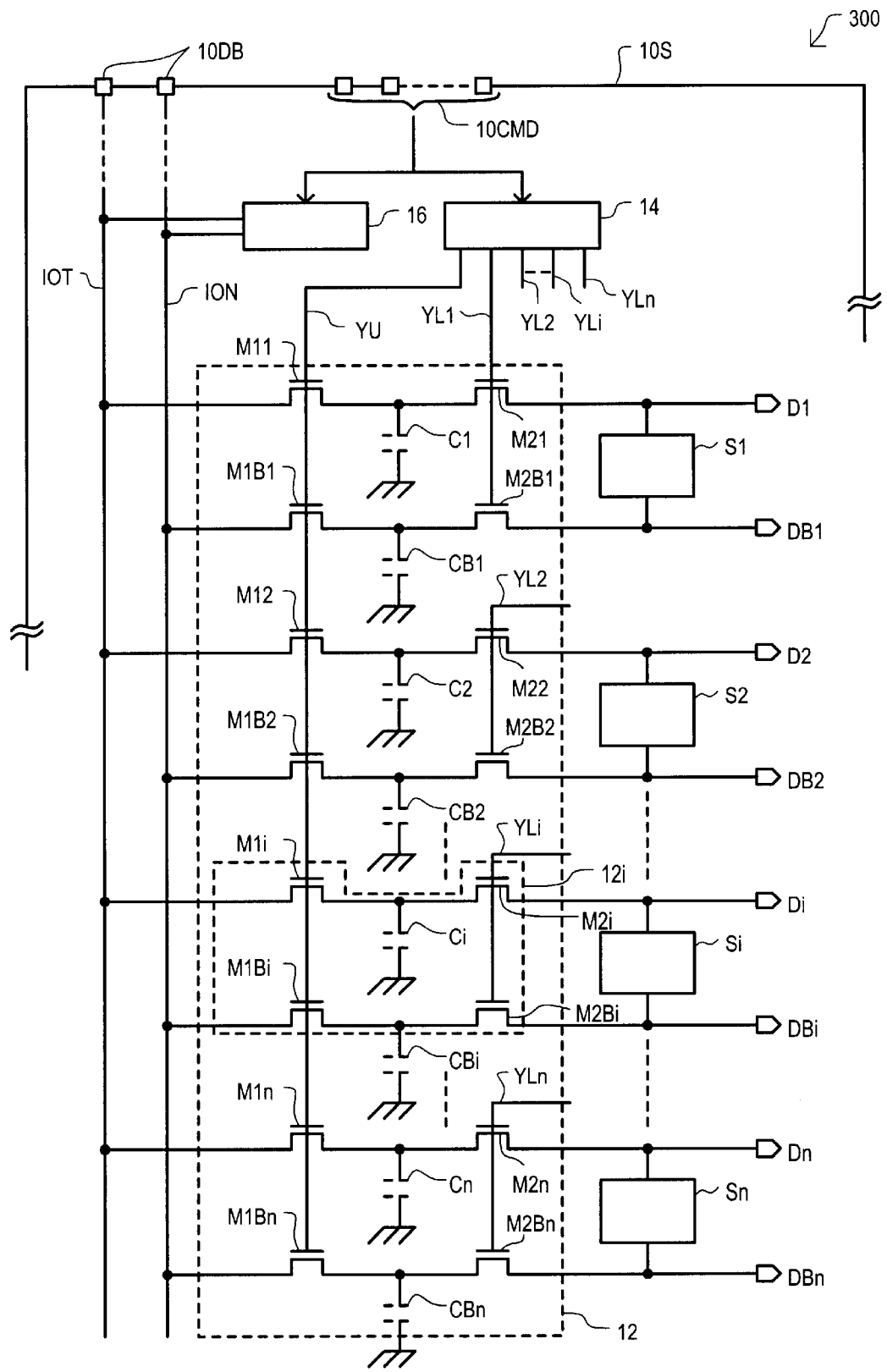
FIG. 3 is a circuit schematic diagram of data transmission/reception apparatus according to a first embodiment.

Referring now to FIG. 3, a circuit schematic diagram of data transmission/reception apparatus according to a first embodiment is set forth and given the general reference character 300. Data transmission/reception apparatus 300 may be disposed in a semiconductor memory device.

Referring now to FIG. 4, a timing diagram illustrating data transmission during a write operation and data reception during a read operation of data transmission/reception apparatus 300 is set forth.

A data transmission/reception apparatus 300 according to the present embodiment may be configured so that when data buses are precharged, connection points between series connected column select transistors (signal transfer devices) may be electrically connected to a precharge circuit. In this way, parasitic capacitors at the connection points may have a charge differential reduced and adverse affects on a voltage signal indicative of read data may be reduced. Thus, read data integrity may be maintained.

As illustrated in FIG. 3, data transmission/reception apparatus 300 may be constructed on a semiconductor substrate 10S. Data transmission/reception apparatus 300 may include a column select transfer gate circuit 12, a column address decode circuit 14, a precharge circuit 16, bit line pairs (D1-DB1 to Dn-DBn), data buses (IOT and ION), and sense amplifiers (S1 to Sn).

Column address decode circuit 14 may receive a column address from a command bus pad 10CMD and may provide column select signals (YU and YL1 to YLn) to column select transfer gate circuit 12. Each bit line pair (D1-DB1 to Dn-DBn) may have a column of memory cells (not shown) connected thereto. Each bit line pair (D1-DB1 to Dn-DBn) may have a sense amplifier (S1 to Sn) respectively connected to sense data from a selected one from the column of memory cells.

Column select transfer gate 12 may provide a data transfer path from a selected bit line pair (D1-DB1 to Dn-DBn) to data buses (IOT and ION) during a read operation and may provide a data transfer path from data buses (IOT and ION) to a selected bit line pair (D1-DB1 to Dn-DBn) during a write operation. Data buses (IOT and ION) may provide data to or receive data from a data bus pad 10DB in accordance with a read or write cycle, respectively. Data buses (IOT and ION) may be connected to data bus pad 10DB through a data buffer (not shown).

Column select transfer gate circuit 12 may include a transfer gate circuit 12$i$ corresponding to a respective bit line pair (Di-DBi), where i may be an integer from 1 to n. Transfer gate circuit 12$i$ may include a first column select transfer gate M1$i$ and a second column select transfer gate M2$i$ connected in series between data bus IOT and bit line Di. Transfer gate circuit 12$i$ may also include a first column select transfer gate M1Bi and a second column select transfer gate M2Bi connected in series between data bus ION and bit line DBi.

First column select transfer gates (M1$i$ and M1Bi) and second column select transfer gates (M2$i$ and M2Bi) may be IGFETs (insulated gate field effect transistors) such as n-type MOSFETs (metal oxide semiconductor field effect transistors) and more particularly may be n-type MODFETs (modulation doped field effect transistors), as just one example. Each bit line pair (Di and DBi) may transmit a complementary binary data signal.

First column select transfer gate M1$i$ may have a source/drain connected to data bus IOT, a gate connected to first column select signal YU, and another source/drain connected to a source/drain of second column select transfer gate M2$i$ at a connection node. Second column select transfer gate M2$i$ may have a gate connected to second column select signal YLi and another source/drain connected to bit line Di.

First column select transfer gate M1Bi may have a source/drain connected to data bus ION, a gate connected to first column select signal YU, and another source/drain connected to a source/drain of second column select transfer gate M2Bi at a connection node. Second column select transfer gate M2Bi may have a gate connected to second column select signal YLi and another source/drain connected to bit line DBi.

Connection nodes in transfer gate circuit 12$i$ may have parasitic capacitance which may be illustrated by parasitic capacitors (Ci and CBi), respectively. Parasitic capacitor Ci may be connected between the connection node of first and second column select transfer gates (M1$i$ and M2$i$). Parasitic capacitor CBi may be connected between the connection node of first and second column select transfer gates (M1Bi and M2Bi).

When a command executing in the processing of a program in a processor (not shown), such as a CPU, requires data to be written to or read from a semiconductor memory device incorporating data transmission/reception apparatus 300, column address decode circuit 14 may decode a column address of the associated command that may be supplied via a predetermined number of command pads 10CMD on semiconductor substrate 10S. Accordingly, column address decode circuit 14 may output first column select signal YU and second column select signal YLi having a high logic level. First and second column select signals (YU and YLi) may transition to a high level at essentially the same time. After data has been transmitted through the selected transfer gate circuit 12$i$, column address decode circuit 14 may bring second column select signal YLi back to a low logic level. Then a predetermined time later, column address decode circuit 14 may bring first column select signal YU back to a logic low level. This is illustrated in the timing diagram of FIG. 4.

A command may be supplied to predetermined ones of command pads 10CMD. The command may correspond to a read command or a write command, as just two examples. A command decoder (not shown) may receive the command and provide internal command signals accordingly.

Referring once again to FIG. 3, first column select signal YU and second column select signal YLi may be generated by column address decode circuit 14 by decoding predetermined column addresses to generate first column select signal YU and second column select signal YLi. Column addresses may be divided into a first group of predetermined column addresses to generate first column select signal YU and a second group of predetermined column addresses to generate second column select signal YLi, as just one example.

In the present invention, the aforementioned predetermined time may be determined by the time required for precharge circuit 16 to drive a precharge potential to floating capacitors (Ci and CAi). In this way, the potential on floating capacitors (Ci and CBi) may be essentially the same as the precharge potential on data buses (IOT and ION). Thus, an offset voltage may not be applied to a voltage signal representing data during a read operation.

Referring once again to FIG. 4, during a precharge P operation, precharge circuit 16 may apply a voltage signal to data buses (IOT and ION). The precharge voltage signal may be at an intermediate potential. The voltage signal may be generated before respective commands (W and R) on the basis of a precharge command P, as illustrated in FIG. 4. After a command (W or R), a precharge command P may occur in synchronism with a clock edge (such as a front edge). The precharge command P may cause second column select signal YLi to transition to a low level. A predetermined time later, column address decode circuit 14 may bring first column select signal YU back to a logic low level. During this predetermined time, precharge circuit 16 may apply a precharge level to data buses (IOT and ION) which may be applied to floating capacitors (Ci and CBi) by way of first column select transfer gates (M1$i$ and M1Bi), respectively. The time required to data buses (IOT and ION) to the intermediate level (precharge level) may be determined by the time constant inherent in the circuit.

It should be noted that precharging data buses (IOT and ION) to the intermediate potential may be required for achieving operations for successively reading and/or writing data at a high speed.

Referring further to FIGS. 3 and 4, the operation of the present embodiment will now be described.

When a write command W is received by the semiconductor memory device as an external input command, a column address in the write command W may be supplied to column address decode circuit 14. Column address decode circuit 14 generates a first and second column select signals (YU and YLi), each having a high level, essentially simultaneously.

A row decode circuit (not shown) may also activate a word line in response to a received row address to bring a row of memory cells into an active state allowing data to be written.

First column select transfer gates (M11-M1B1 to M1$n$ to M1Bn) may be activated by first column select signal YU and essentially simultaneously, second column select transfer gates (M2$i$ and M2Bi) may be activated by second column select signal YLi. This may be illustrated in FIG. 4 as the rising edges of first and second column select signals (YU and YLi) after a write command W is received.

Floating capacitors (Ci and CBi) formed at connection points of first and second transfer gates (M1$i$-M2$i$ and M1Bi-M2Bi) may be charged with the write data value transmitted through data busses (IOT and ION) to selected bit lines (Di and DBi) when data is written into the selected memory cell (not shown). Floating capacitors (Ci and CBi) may be parasitic capacitors.

As illustrated in FIG. 4, after writing data into the selected memory cell, second column select signal YLi may switch from a high to a low level. This may be in response to a precharge command P, for example. In this way, second column select transfer gates (M2$i$ and M2Bi) may be turned off.

However, first column select signal YU may remain at the high level for a predetermined time after first column select signal YLi transitions to the low level.

During this predetermined time, data buses (IOT and ION) and floating capacitors (Ci and CBi), on which the aforementioned write data has been applied, are driven to an intermediate level (precharge level) by precharge circuit 16.

The time required to essentially provide the intermediate level to the data buses (IOT and ION) and floating capacitors (Ci and CBi) may provide the predetermined time that the first column select signal YU may remain at the high level for a predetermined time after first column select signal YLi transitions to the low level. After this predetermined time, second column select signal YU may transition to the low level (trailing edge of YU illustrated in FIG. 4). At this time first column select transfer gates (M1$i$ and M1Bi) may be turned off.

The precharge operation by precharge circuit 16 may be essentially finished at the time first column select transfer gates (M1$i$ and M1Bi) are turned off.

Thus, the write operation may be completed.

When a write command W is followed by a read command R (for example the second write command W followed by the read command R, as illustrated in FIG. 4), a column address in read command R may be applied to column address decode circuit 14 and first column select signal YU and second column select signal YLi may transition to a high level. This may function in a similar manner as in the write operation as previously described.

A row decode circuit (not shown) may also activate a word line in response to a received row address to bring a row of memory cells into an active state allowing data to be read.

Accordingly, data is output from a selected bit line pair (Di and DBi) to data buses (IOT and ION) through transfer gate circuit 12$i$. It is noted that floating capacitors (Ci and CBi) formed at connection points of first and second transfer gates (M1$i$-M2$i$ and M1Bi-M2Bi) have been precharged to an intermediate level, so that an offset voltage may not be coupled to a voltage signal representative of the read data during the read operation. In this way, the integrity of the read data may be improved.

In the present embodiment, as described above, the column select transfer gates (M1$i$ and M1Bi) may not be turned off until a predetermined time delay after the column select transfer gates (M2$i$ and M2Bi) are turned off. In this way, the floating capacitors (Ci and CBi) may be electrically disconnected from the bit lines (Di and DBi) and sense amplifier S$i$ while still remaining electrically connected to the data buses (IOT and ION) for a predetermined time to allow the intermediate level to be received during a precharge operation.

Because data buses (IOT and ION) are precharged while remaining electrically connected to floating capacitors (Ci and CBi), an offset potential may be minimized or eliminated to prevent an adverse affect on the reading of data. Thus, data integrity may be improved and operating margins may increase.

Figure 5:
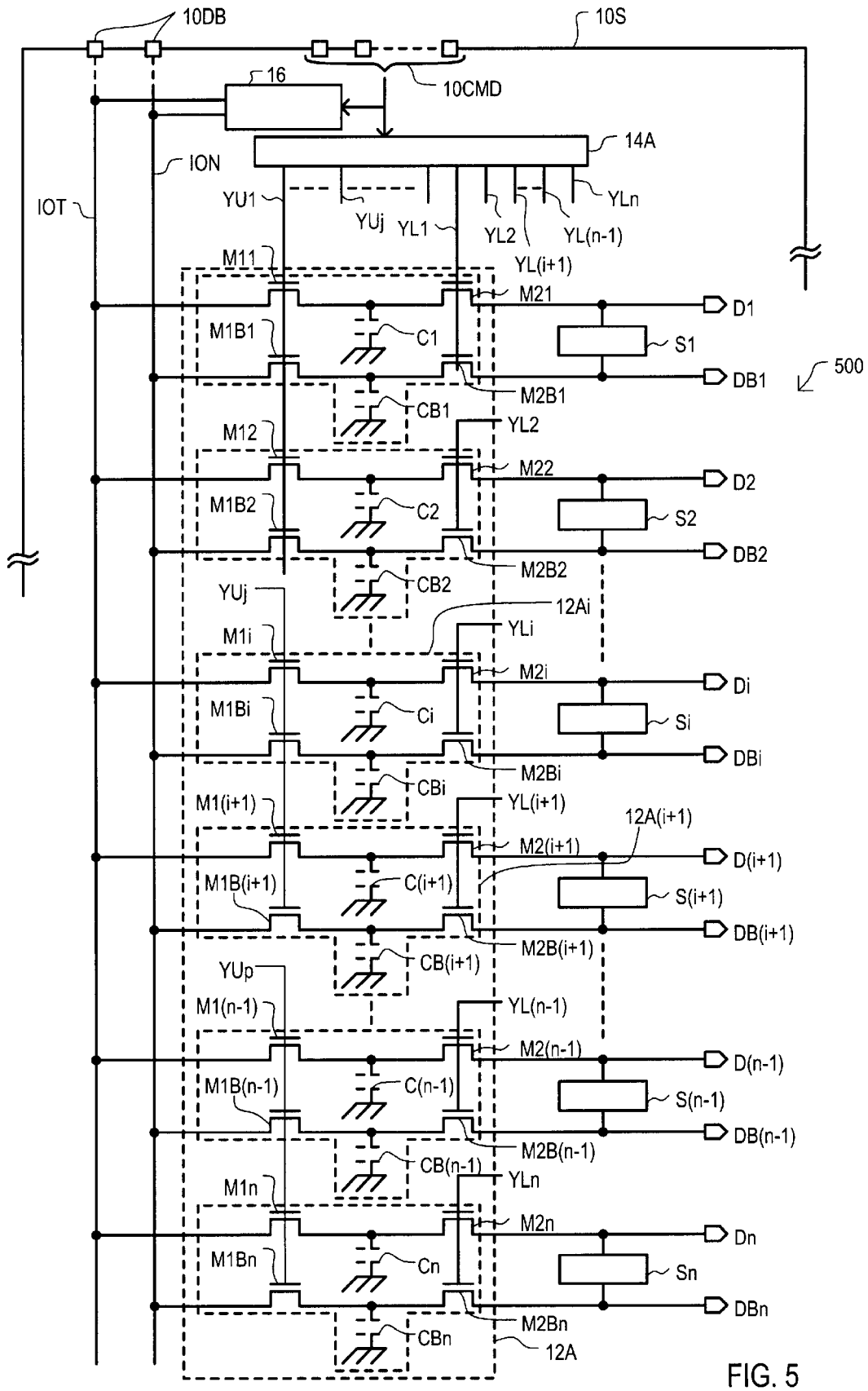
FIG. 5 is a circuit schematic diagram of data transmission/reception apparatus according to a second embodiment.

Referring now to FIG. 5, a circuit schematic diagram of data transmission/reception apparatus according to a second embodiment is set forth and given the general reference character 500. Data transmission/reception apparatus 500 may be disposed in a semiconductor memory device.

Figure 6:
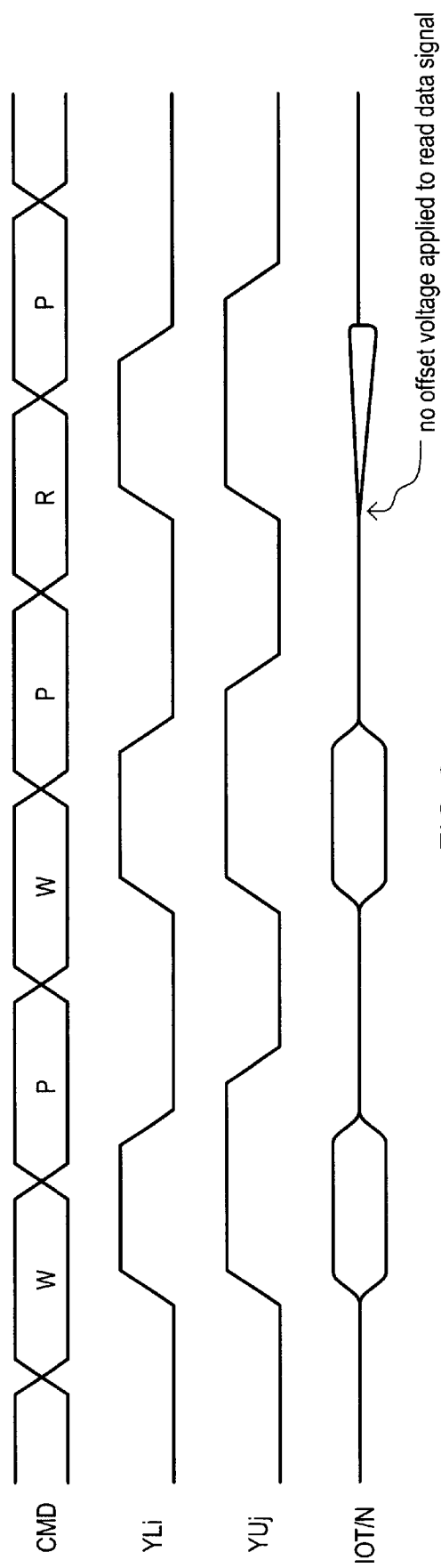
FIG. 6 is a timing diagram illustrating data transmission during a write operation and data reception during a read operation of a data transmission/reception apparatus according to one embodiment.

Referring now to FIG. 6, a timing diagram illustrating data transmission during a write operation and data reception during a read operation of data transmission/reception apparatus 500 is set forth.

In the second embodiment illustrated in FIGS. 5 and 6, similar constituents as in the first embodiment may be referred to by the same general reference character.

The present embodiment may differ from the first embodiment as follows. In the first embodiment, the turning on (activation) and the turning off (deactivation) of a column select transfer gate (first column select transfer gate) connected to data buses (IOT and ION) may be controlled through a common column select signal YU connected to all first column select transfer gates (M11-M1B1 to M1$n$-M1Bn). However, in the present embodiment, column select transfer gate circuit 12A, includes a column select signal YUj connected to control the turning on and turning off of a group of column select transfer gates (first column select transfer gates) and in the present embodiment, the group may comprise first column select transfer gates (M1$i$-M1B$i$ and M1(i+1)-M1B(i+1)) included in two transfer gate circuits (12Ai and 12A(i+1)) respectively connected to two bit lines (Di-DBi and D(i+1)-DB(i+1)).

As illustrated in FIG. 5, data transmission/reception apparatus 500 may be constructed on a semiconductor substrate 10S. Data transmission/reception apparatus 300 may include a column select transfer gate circuit 12A, a column address decode circuit 14A, a precharge circuit 16, bit line pairs (D1-DB1 to Dn-DBn), data buses (IOT and ION), and sense amplifiers (S1 to Sn).

Column address decode circuit 14A may receive a column address from a command bus pad 10CMD and may provide column select signals (YU1 to YUj and YL1 to YLn, where j=n/2) to column select transfer gate circuit 12A. Each bit line pair (D1-DB1 to Dn-DBn) may have a column of memory cells (not shown) connected thereto. Each bit line pair (D1-DB1 to Dn-DBn) may have a sense amplifier (S1 to Sn) respectively connected to sense data from a selected one from the column of memory cells.

Column select transfer gate 12A may provide a data transfer path from a selected bit line pair (D1-DB1 to Dn-DBn) to data buses (IOT and ION) during a read operation and may provide a data transfer path from data buses (IOT and ION) to a selected bit line pair (D1-DB1 to Dn-DBn) during a write operation. Data buses (IOT and ION) may provide data to or receive data from a data bus pad 10DB in accordance with a read or write cycle, respectively. Data buses (IOT and ION) may be connected to data bus pad 10DB through a data buffer (not shown).

Column select transfer gate circuit 12A may include a transfer gate circuits (12Ai and 12A(i+1)), corresponding respectively to bit line pairs (Di-DBi and D(i+1)-DB(i+1)), where i may be an integer from 1 to n/2. Transfer gate circuit 12Ai may include a first column select transfer gate M1$i$ and a second column select transfer gate M2$i$ connected in series between data bus IOT and bit line Di. Transfer gate circuit 12Ai may also include a first column select transfer gate M1B$i$ and a second column select transfer gate M2B$i$ connected in series between data bus ION and bit line DBi. Transfer gate circuit 12A(i+1) may include a first column select transfer gate Ml(i+11) and a second column select transfer gate M2(i+1) connected in series between data bus IOT and bit line D(i+11). Transfer gate circuit 12A(i+1) may also include a first column select transfer gate MlB(i+1) and a second column select transfer gate M2B(i+1) connected in series between data bus ION and bit line DB(i+1).

First column select transfer gate M1$i$ may have a source/drain connected to data bus IOT, a gate connected to first column select signal YUj, and another source/drain connected to a source/drain of second column select transfer gate M2$i$ at a connection node. Second column select transfer gate M2$i$ may have a gate connected to second column select signal YLi and another source/drain connected to bit line Di. First column select transfer gate Ml(i+1) may have a source/drain connected to data bus IOT, a gate connected to first column select signal YUj, and another source/drain connected to a source/drain of second column select transfer gate M2(i+1) at a connection node. Second column select transfer gate M2(i+1) may have a gate connected to second column select signal YL(i+1) and another source/drain connected to bit line D(i+1).

First column select transfer gate M1B$i$ may have a source/drain connected to data bus ION, a gate connected to first column select signal YUj, and another source/drain connected to a source/drain of second column select transfer gate M2B$i$ at a connection node. Second column select transfer gate M2B$i$ may have a gate connected to second column select signal YLi and another source/drain connected to bit line DB$i$. First column select transfer gate M1B(i+1) may have a source/drain connected to data bus ION, a gate connected to first column select signal YUj, and another source/drain connected to a source/drain of second column select transfer gate M2B(i+1) at a connection node. Second column select transfer gate M2B(i+1) may have a gate connected to second column select signal YL(i+1) and another source/drain connected to bit line DB(i+1).

Connection nodes in transfer gate circuit 12$i$ may have parasitic capacitance which may be illustrated by parasitic capacitors (Ci and CBi), respectively. Parasitic capacitor Ci may be connected between the connection node of first and second column select transfer gates (M1$i$ and M2$i$). Parasitic capacitor CBi may be connected between the connection node of first and second column select transfer gates (M1B$i$ and M2B$i$).

Connection nodes in transfer gate circuit 12(i+1) may have parasitic capacitance which may be illustrated by parasitic capacitors (C(i+1) and CB(i+1)), respectively. Parasitic capacitor C(i+1) may be connected between the connection node of first and second column select transfer gates (Ml(i+1) and M2(i+1)). Parasitic capacitor CB(i+1) may be connected between the connection node of first and second column select transfer gates (MlB(i+1) and M2B(i+1)).

When a command executing in the processing of a program in a processor (not shown), such as a CPU, requires data to be written to or read from a semiconductor memory device incorporating data transmission/reception apparatus 500, column address decode circuit 14A may decode a column address of the associated command that may be supplied via a predetermined number of command pads 10CMD on semiconductor substrate 10S. Accordingly, column address decode circuit 14A may output first column select signal YUj and second column select signal YLi having a high logic level. First and second column select signals (YUj and YLi) may transition to a high level at essentially the same time. After data has been transmitted through the selected transfer gate circuit 12Ai, column address decode circuit 14A may bring second column select signal YLi back to a low logic level. Then a predetermined time later, column address decode circuit 14A may bring first column select signal YUj back to a logic low level. This is illustrated in the timing diagram of FIG. 6.

A command may be supplied to predetermined ones of command pads 10CMD. The command may correspond to a read command or a write command, as just two examples. A command decoder (not shown) may receive the command and provide internal command signals accordingly.

Referring once again to FIG. 5, first column select signal YUj and second column select signal YLi may be generated by column address decode circuit 14A by decoding predetermined column addresses to generate first column select signal YUj and second column select signal YLi. Column addresses may be divided into a first group of predetermined column addresses to generate first column select signal YUj and a second group of predetermined column addresses to generate second column select signal YLi, as just one example.

Referring further to FIGS. 5 and 6, the operation of the present embodiment will now be described.

When a write command W is received by the semiconductor memory device as an external input command, a column address in the write command W may be supplied to column address decode circuit 14A. Column address decode circuit 14A generates a first and second column select signals (YUj and YLi), each having a high level), essentially simultaneously.

A row decode circuit (not shown) may also activate a word line in response to a received row address to bring a row of memory cells into an active state allowing data to be written.

First column select transfer gates (M1i-M1Bi and M1(i+1) to M1B(i+1)) may be activated by first column select signal YUj and essentially simultaneously, second column select transfer gates (M2i and M2Bi) may be activated by second column select signal YLi. This may be illustrated in FIG. 6 as the rising edges of first and second column select signals (YUj and YLi) after a write command W is received.

Floating capacitors (Ci and CBi) formed at connection points of first and second transfer gates (M1i-M2i and M1Bi-M2Bi) may be charged with the write data value transmitted through data busses (IOT and ION) to selected bit lines (Di and DBi) when data is written into the selected memory cell (not shown). Floating capacitors (Ci and CBi) may be parasitic capacitors.

As illustrated in FIG. 6, after writing data into the selected memory cell, second column select signal YLi may switch from a high to a low level. This may be in response to a precharge command P, for example. In this way, second column select transfer gates (M2i and M2Bi) may be turned off.

However, first column select signal YUj may remain at the high level for a predetermined time after first column select signal YLi transitions to the low level.

During this predetermined time, data buses (IOT and ION) and floating capacitors (Ci and CBi), on which the aforementioned write data has been applied, are driven to an intermediate level (precharge level) by precharge circuit 16.

The time required to essentially provide the intermediate level to the data buses (IOT and ION) and floating capacitors (Ci and CBi) may provide the predetermined time that the first column select signal YUj may remain at the high level for a predetermined time after first column select signal YLi transitions to the low level. After this predetermined time, second column select signal YUj may transition to the low level (trailing edge of YUj illustrated in FIG. 6). At this time first column select transfer gates (M1i and M1Bi) may be turned off.

The precharge operation by precharge circuit 16 may be essentially finished at the time first column select transfer gates (M1i and M1Bi) are turned off.

Thus, the write operation may be completed.

When a write command W is followed by a read command R (for example the second write command W followed by the read command R, as illustrated in FIG. 6), a column address in read command R may be applied to column address decode circuit 14A and first column select signal YUj and second column select signal YLi may transition to a high level. This may function in a similar manner as in the write operation as previously described.

A row decode circuit (not shown) may also activate a word line in response to a received row address to bring a row of memory cells into an active state allowing data to be read.

Accordingly, data is output from a selected bit line pair (Di and DBi) to data buses (IOT and ION) through transfer gate circuit 12i. It is noted that floating capacitors (Ci and CBi) formed at connection points of first and second transfer gates (M1i-M2i and M1Bi-M2Bi) have been precharged to an intermediate level, so that an offset voltage may not be coupled to a voltage signal representative of the read data during the read operation. In this way, the integrity of the read data may be improved.

In the present embodiment, as described above, the column select transfer gates (M1i and M1Bi) may not be turned off until a predetermined time delay after the column select transfer gates (M2i and M2Bi) are turned off. In this way, the floating capacitors (Ci and CBi) may be electrically disconnected from the bit lines (Di and DBi) and sense amplifier Si while still remaining electrically connected to the data buses (IOT and ION) for a predetermined time to allow the intermediate level to be received during a precharge operation.

Because data buses (IOT and ION) are precharged while remaining electrically connected to floating capacitors (Ci and CBi), an offset potential may be minimized or eliminated to prevent an adverse affect on the reading of data. Thus, data integrity may be improved and operating margins may increase.

Figure 7:
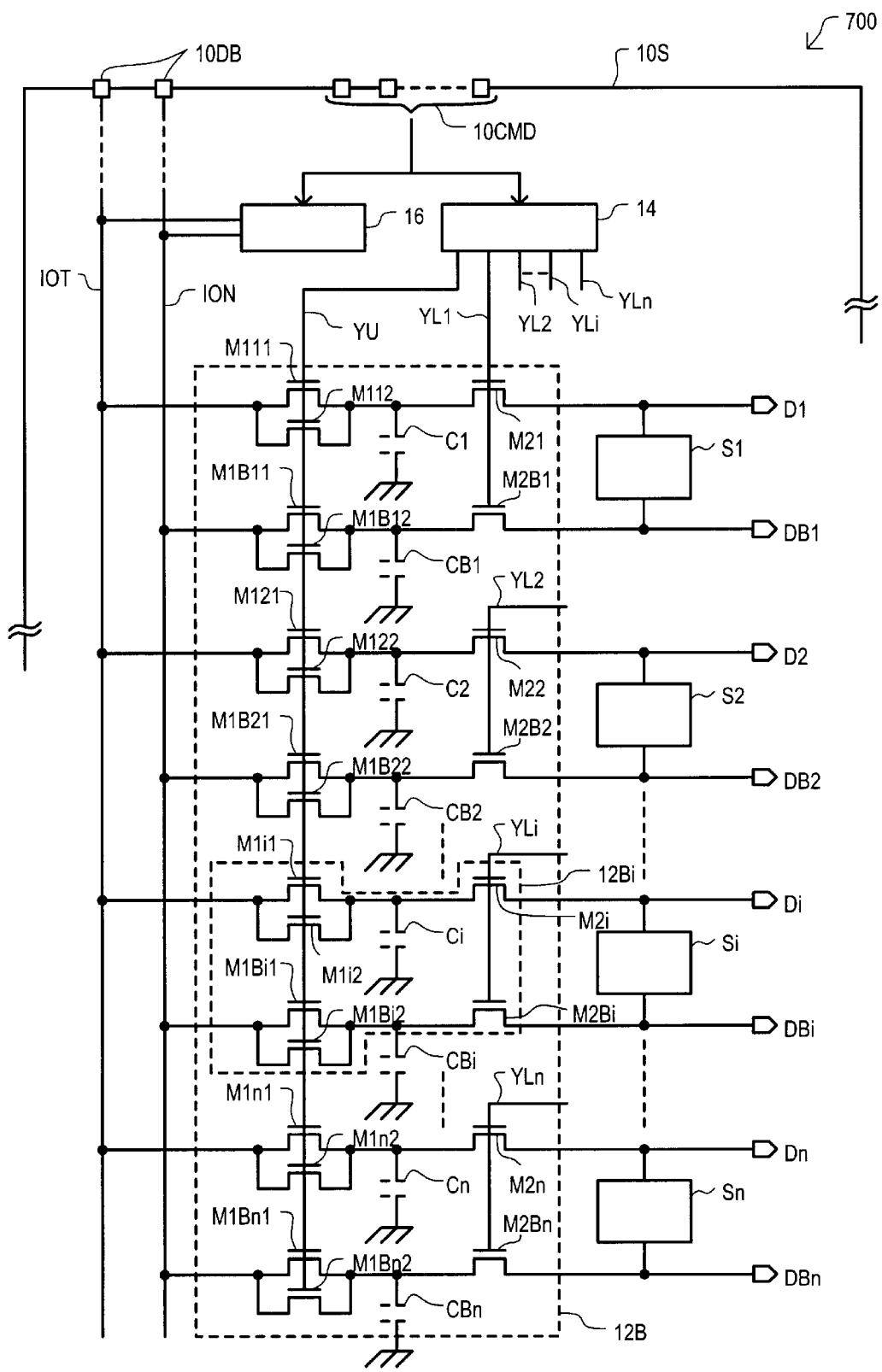
FIG. 7 is a circuit schematic diagram of data transmission/reception apparatus according to a third embodiment.

Referring now to FIG. 7, a circuit schematic diagram of data transmission/reception apparatus according to a third embodiment is set forth and given the general reference character 700. Data transmission/reception apparatus 700 may be disposed in a semiconductor memory device.

In the third embodiment illustrated in FIG. 7, similar constituents as in the first embodiment may be referred to by the same general reference character.

The present embodiment may differ from the first embodiment as follows. In the third embodiment, column select transfer gate (corresponding to first column select transfer gates (M11-M1B1 to M1n-M1Bn) of the first embodiment) connected to data buses (IOT and ION) may include parallel connected column select transfer gates. For example, first column select transfer gate M1i of the first embodiment may correspond to parallel connected first column select transfer gates (M1i1 and M1i2) of the third embodiment. This may provide a layout advantage by providing separate gate "fingers" for each gate so that each gate may have a reduced gate width, as just one example.

Data transmission/reception apparatus 700 may include a column select transfer gate circuit 12B providing a data transfer path from a selected bit line pair (D1-DB1 to Dn-DBn) to data buses (IOT and ION) during a read operation and may provide a data transfer path from data buses (IOT and ION) to a selected bit line pair (D1-DB1 to Dn-DBn) during a write operation.

Column select transfer gate circuit 12B may include a transfer gate circuit 12Bi corresponding to a respective bit line pair (Di-DBi), where i may be an integer from 1 to n. Transfer gate circuit 12Bi may include first column select transfer gates (M1i1 and M1i 2) connected in parallel which may then be connected in series with a second column select transfer gate M2i between data bus IOT and bit line Di. Transfer gate circuit 12Bi may also include first column select transfer gates (M1Bi1 and M1Bi2) connected in parallel which may then be connected in series with a second column select transfer gate M2Bi connected in series between data bus ION and bit line DBi.

First column select transfer gate M1i1 may have a source/drain connected to data bus IOT, a gate connected to first column select signal YU, and another source/drain connected to a source/drain of second column select transfer gate M2i at a connection node. First column select transfer gate M1i2 may have a source/drain connected to data bus IOT, a gate connected to first column select signal YU, and another source/drain connected to a source/drain of second column select transfer gate M2i at a connection node. Second column select transfer gate M2i may have a gate connected to second column select signal YLi and another source/drain connected to bit line Di.

First column select transfer gate M1Bi1 may have a source/drain connected to data bus ION, a gate connected to first column select signal YU, and another source/drain connected to a source/drain of second column select transfer gate M2Bi at a connection node. First column select transfer gate M1Bi2 may have a source/drain connected to data bus ION, a gate connected to first column select signal YU, and another source/drain connected to a source/drain of second column select transfer gate M2Bi at a connection node. Second column select transfer gate M2Bi may have a gate connected to second column select signal YLi and another source/drain connected to bit line DBi.

Connection nodes in transfer gate circuit 12Bi may have parasitic capacitance which may be illustrated by parasitic capacitors (Ci and CBi), respectively. Parasitic capacitor Ci may be connected between the connection node of first and second column select transfer gates (M1i1-M1i 2 and M2i). Parasitic capacitor CBi may be connected between the connection node of first and second column select transfer gates (M1Bi1-M1Bi2 and M2Bi).

Referring further to FIGS. 4 and 7, the operation of the present embodiment will now be described.

When a write command W is received by the semiconductor memory device as an external input command, a column address in the write command W may be supplied to column address decode circuit 14 of data transmission/reception apparatus 700. Column address decode circuit 14 may generate a first and second column select signals (YU and YLi), each having a high level), essentially simultaneously, as illustrated in FIG. 4.

First column select transfer gates (M111-M112-M1B11-M1B12 to M1n1-M1n2-M1Bn1-M1Bn2) may be activated by first column select signal YU and essentially simultaneously, second column select transfer gates (M2i and M2Bi) may be activated by second column select signal YLi. This may be illustrated in FIG. 4 as the rising edges of first and second column select signals (YU and YLi) after a write command W is received.

Floating capacitors (Ci and CBi) formed at connection points of first and second transfer gates ((M1i 1 and M1i 2)-M2i and (M1Bi1 and M1Bi2)-M2Bi) may be charged with the write data value transmitted through data busses (IOT and ION) to selected bit lines (Di and DBi) when data is written into the selected memory cell (not shown). Floating capacitors (Ci and CBi) may be parasitic capacitors.

As illustrated in FIG. 4, after writing data into the selected memory cell, second column select signal YLi may switch from a high to a low level. This may be in response to a precharge command P, for example. In this way, second column select transfer gates (M2i and M2Bi) may be turned off.

However, first column select signal YU may remain at the high level for a predetermined time after first column select signal YLi transitions to the low level.

During this predetermined time, data buses (IOT and ION) and floating capacitors (Ci and CBi), on which the aforementioned write data has been applied, are driven to an intermediate level (precharge level) by precharge circuit 16.

The time required to essentially provide the intermediate level to the data buses (IOT and ION) and floating capacitors (Ci and CBi) may provide the predetermined time that the first column select signal YU may remain at the high level for a predetermined time after first column select signal YLi transitions to the low level. After this predetermined time, second column select signal YU may transition to the low level (trailing edge of YU illustrated in FIG. 4). At this time first column select transfer gates (M1i and M1Bi) may be turned off.

The precharge operation by precharge circuit 16 may be essentially finished at the time first column select transfer gates ((M1i 1 and M1i 2) and (M1Bi1 and M1Bi2)) are turned off.

Thus, the write operation may be completed.

When a write command W is followed by a read command R (for example the second write command W followed by the read command R, as illustrated in FIG. 4), a column address in read command R may be applied to column address decode circuit 14 and first column select signal YU and second column select signal YLi may transition to a high level. This may function in a similar manner as in the write operation as previously described.

Accordingly, data is output from a selected bit line pair (Di and DBi) to data buses (IOT and ION) through transfer gate circuit 12Bi. It is noted that floating capacitors (Ci and CBi) formed at connection points of first and second transfer gates ((M1i1 and M1i 2)-M2i and (M1Bi1 and M1Bi2)-M2Bi) have been precharged to an intermediate level, so that an offset voltage may not be coupled to a voltage signal representative of the read data during the read operation. In this way, the integrity of the read data may be improved.

In the present embodiment, as described above, the column select transfer gates ((M1i1 and M1i 2) and (M1Bi1 and M1Bi2)) may not be turned off until a predetermined time delay after the column select transfer gates (M2i and M2Bi) are turned off. In this way, the floating capacitors (Ci and CBi) may be electrically disconnected from the bit lines (Di and DBi) and sense amplifier Si while still remaining electrically connected to the data buses (IOT and ION) for a predetermined time to allow the intermediate level to be received during a precharge operation.

Because data buses (IOT and ION) are precharged while remaining electrically connected to floating capacitors (Ci and CBi), an offset potential may be minimized or eliminated to prevent an adverse affect on the reading of data. Thus, data integrity may be improved and operating margins may increase.

It is understood that the embodiments described above are exemplary and the present invention should not be limited to those embodiments. Specific structures should not be limited to the described embodiments.

Referring now to FIG. 3, in the embodiments the precharge operation in which data buses (IOT and ION) are precharged by precharge circuit 16 may begin slightly before second column select transfer gates (M2i and M2Bi) are turned off by second column select transistor YLi. Likewise, the precharge operation may not end until after first column select transistors (M11-M1B1 to M1n-M1Bn) are turned off by first column select signal YU.

Also, instead of setting parasitic capacitors (Ci and CBi) to a precharge level through precharge circuit 16 in conjunction with precharging data buses (IOT and ION), a separate circuit may be provided to provide a precharge condition to parasitic capacitors (Ci and CBi). The precharge level of parasitic capacitors (Ci and CBi) may be a different potential than data buses (IOT and ION), for example, a power supply potential such as VDD or ground, as just two examples. The precharging of parasitic capacitors (Ci and CBi) through a separate circuit may occur at essentially the same time as precharging data buses (IOT and ION). Also, first and second column select signals (YU and YLi) may be low during this time.

Precharge circuit 16 may be constructed externally to the semiconductor substrate 10S. In this case, a precharge potential provided by the precharge circuit 16 may be electrically connected to data buses (IOT and ION) on the basis of a precharge command.

In the embodiments, column select transfer gates may be constructed with NMOSFETs, column select transfer gates may be constructed with other transistors, such as enhancement or depletion PMOSFETs or NMOSFETs, as just a few examples. It may also be possible to construct the column select transfer gate with a bipolar transistor, such as a PNP transistor, for example.

Although the embodiments were described in which data may be transmitted and received between data buses (IOT and ION) and a bit line pair (Di and DBi) in a binary complementary manner, the present invention may also be applicable to data transmission/reception may include multiple data values. This may be applicable when a memory cell storing multiple data values is implemented, for example.

Although, in the embodiments, data was transferred in a binary complementary manner using voltage signals, the present invention may also be applicable when data is transmitted using a current signal, for example. Data may also be transmitted in a non-complementary manner, as just one example.

According to the embodiments, data may be transmitted in a complementary binary fashion from a first data transmission/reception apparatus to a second data transmission/reception apparatus through a signal transfer apparatus. A signal transfer device connected to the second data transmission/reception apparatus may be placed into an interrupted state. A precharge may be executed to that electric potentials on connection points between a signal transfer device connected to the second data transmission/ reception apparatus and a signal transfer device connected to the first data transmission/reception apparatus may be set to minimize or eliminate an offset between two connection points in which complementary data may be applied. The precharge potential may be an intermediate level and may reduce or eliminate an offset applied based on a previous data transfer. Subsequently, the signal transfer device connected to the first data transmission/reception apparatus may be placed into an interrupted state. In this way, floating parasitic capacitors at the connection points may not store an offset voltage, so that subsequent data transfers may have improved signal levels and data integrity may be improved.

Also, the mode of selecting the signal transfer device provided on the side of the first data transmission/reception apparatus may differ from the mode of selecting the signal transfer device provided on the side of the second data transmission/reception apparatus. For example, the decoding may be different, such that addresses may select one signal transfer device, while a control signal may select the other signal transfer device. However, in these exemplary cases, the same effect may be ensured.

Also, the charge transfer during precharge may be improved by constructing a first signal transfer circuit having devices arranged in parallel. In this case, layout area may also be minimized by provided multiple gate "fingers" instead of one, so that the first signal transfer circuit may be more densely arranged.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A method for data transmission/reception, comprising:

activating essentially simultaneously a first signal transfer device and a second signal transfer device electrically connected in series to provide a data transfer path between a first data transmission/reception apparatus and a second data transmission/reception apparatus;

after bringing the second signal transfer device into a second signal transfer device data transfer interrupt state, setting an electric potential on a parasitic capacitor at a connection point between the first signal transfer device and the second signal transfer device; and upon completion of setting the electric potential, bringing the first signal transfer device into a first signal transfer device data interrupt state.

2. The method for data transmission/reception according to claim 1, wherein:

data being transmitted has data values represented by first and second electric potential levels; and setting the electric potential includes, after bringing the second signal transfer device into the second signal transfer device data interrupt state, precharging the electric potential at the connection point to a precharge level between the first and second electric potential levels.

3. The method for data transmission/reception according to claim 2, wherein:

precharging includes precharging a first data transmission/reception data line to essentially the electric potential during a time period from bringing the second signal transfer device into the second signal transfer device data transfer interrupt state to bringing the first signal transfer device into the first signal transfer device data transfer interrupt state.

4. The method for data transmission/reception according to claim 2, wherein:

the transmission of data between the first data transmission/reception apparatus and the second data transmission/reception apparatus is achieved by essentially simultaneously transmitting complementary data values.

5. The method for data transmission/reception according to claim 2, wherein:

the second data transmission/reception apparatus is a semiconductor memory having data transmitted on a bit line electrically connected to the second signal transfer device;

the first data transmission/reception apparatus includes a first data transmission/reception data line electrically connected to the first signal transfer device; and precharging includes precharging the first data transmission/reception data line to essentially the electric potential during a time period from bringing the second signal transfer device into the second signal transfer device data transfer interrupt state to bringing the first signal transfer device into the first signal transfer device data transfer interrupt state.

6. An apparatus for data transmission/reception in which data is transferred between a second data transmission/reception apparatus and a first data transmission/reception apparatus through a first signal transfer device and a second signal transfer device electrically connected in series, comprising:

a first data transfer passage electrically connected to the first data transmission/reception apparatus and the first signal transfer device;

the second signal transfer device electrically connected between the first signal transfer device and the second data transmission/reception apparatus;

the first signal transfer device and the second signal transfer device being activated essentially simultaneously to transfer data from the first data transmission/reception apparatus to the second data transmission/reception apparatus and data being transferred has data values represented by first and second electric potential levels;

a transfer device control circuit supplying a second control signal coupled to a control terminal of the second signal transfer device and a first control signal coupled to a control terminal of the first signal transfer device wherein the second control signal disables the second signal transfer device a predetermined time before the first control signal disables the first signal transfer device after the transfer of data; and a precharge circuit coupled to supply a precharge level that is between the first and second electric potential levels to the first data transfer passage during the predetermined time before the first control signal disables the first signal transfer device after the transfer of data.

7. The apparatus for data transmission/reception of claim 6, wherein:

the precharge circuit begins supplying the precharge level to the first data transmission passage after the second control signal disables the second signal transfer device.

8. The apparatus for data transmission/reception of claim 6, wherein:

the precharge circuit precharges the first data transmission passage to essentially the precharge level during the predetermined time before the first control signal disables the first signal transfer device.

9. The apparatus for data transmission/reception of claim 6, wherein:

the transfer of data includes transferring complementary data signals.

10. The apparatus for data transmission/reception of claim 6, including:

a third signal transfer device connected in parallel with the first signal transfer device and having a control terminal coupled to receive the first control signal.

11. The apparatus for data transmission/reception of claim 6, wherein:

the first signal transfer device and the second signal transfer device are insulated gate field effect transistors (IGFETs).

12. The apparatus for data transmission/reception of claim 11, wherein:

the first data transfer passage, the first signal transfer device, the second signal transfer device, the second data transmission/reception apparatus, and the transfer device control circuit are formed on a semiconductor substrate and an output of the first data transmission/reception apparatus is coupled to a pad formed on the semiconductor substrate and the pad is further coupled to the first data transfer passage.

13. The apparatus for data transmission/reception of claim 12, wherein:

the precharge circuit is formed on the semiconductor substrate and supplies the precharge level to the first data transfer passage in response to a precharge command received by at least one command pad formed on the semiconductor substrate.

14. The apparatus for data transmission/reception of claim 6, wherein:

the first data transmission/reception apparatus is a data processing apparatus;

the second data transmission/reception apparatus is a semiconductor memory device including a bit line electrically connected to the second signal transfer device;

the first data transfer passage is a data bus for transferring data between the data processing apparatus and the semiconductor memory device;

the first control signal is a first column select signal generated on the basis of at least a first portion of a column address supplied from the data processing apparatus to the semiconductor memory device; and the second control signal is a second column select signal generated on the basis of at least a second portion of the column address.

15. An apparatus for data transmission/reception, comprising:

a transfer circuit including a first signal transfer device and a second signal transfer device electrically connected in series to provide a first data transfer path between a first data transmission/reception apparatus and a second data transmission/reception apparatus;

a transfer device control circuit coupled to the transfer circuit wherein the transfer device control circuit activates the first and second signal transfer devices to transfer data from the first data transmission/reception apparatus to the second data transmission/reception apparatus and disables the second signal transfer device a predetermined time before disabling the first signal transfer device after the data transfer; and a precharge circuit coupled to supply a precharge level to a first connection node between the first signal transfer device and second signal transfer device during the predetermined time.

16. The apparatus for data transmission/reception of claim 15, wherein:

the precharge level is supplied through the first signal transfer device to the first connection node.

17. The apparatus for data transmission/reception of claim 16, wherein:
the first signal transfer device is electrically connected to a first data line of the first data transmission/reception apparatus and the second signal transfer device is electrically connected to a second data line of the second data transmission/reception apparatus; and
the precharge circuit supplies the precharge level to the first data line.

18. The apparatus for data transmission/reception of claim 17, further including:
the transfer circuit includes a third signal transfer device and a fourth signal transfer device electrically connected in series to provide a complementary first data transfer path between the first data transmission/reception apparatus and the second data transmission/reception apparatus;
the transfer device control circuit is coupled to the transfer circuit wherein the transfer device control circuit activates the third and fourth signal transfer devices to transfer data from the first data transmission/reception apparatus to the second data transmission/reception apparatus and disables the fourth signal transfer device the predetermined time before disabling the third signal transfer device after the data transfer; and
the precharge circuit is coupled to supply the precharge level to a second connection node between the third signal transfer device and fourth signal transfer device during the predetermined time;
the third signal transfer device is electrically connected to a complementary first data line of the first data transmission/reception apparatus and the fourth signal transfer device is electrically connected to a complementary second data line of the second data transmission/reception apparatus; and
the precharge circuit supplies the precharge level to the complementary first data line.

19. The apparatus for data transmission/reception of claim 18 is a semiconductor memory device, wherein:
the transfer device control circuit is a column address decoder circuit.

20. The apparatus for data transmission/reception of claim 19, wherein:
data is transmitted in a complementary fashion having a first potential and a second potential and the precharge level is between the first and second potentials.

* * * * *